(12) United States Patent
Jia et al.

(10) Patent No.: US 10,657,353 B2
(45) Date of Patent: May 19, 2020

(54) PHOTOELECTRIC SENSOR, ARRAY SUBSTRATE, DISPLAY PANEL AND DISPLAY DEVICE

(71) Applicant: BOE TECHNOLOGY GROUP CO., LTD., Beijing (CN)

(72) Inventors: Yanan Jia, Beijing (CN); Xue Dong, Beijing (CN); Jing Lv, Beijing (CN); Haisheng Wang, Beijing (CN); Chun Wei Wu, Beijing (CN); Yingming Liu, Beijing (CN); Rui Xu, Beijing (CN); Changfeng Li, Beijing (CN); Lijun Zhao, Beijing (CN); Pinchao Gu, Beijing (CN); Yunke Qin, Beijing (CN); Yanling Han, Beijing (CN); Yuzhen Guo, Beijing (CN); Congcong Wei, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 77 days.

(21) Appl. No.: 16/027,916

(22) Filed: Jul. 5, 2018

(65) Prior Publication Data
US 2019/0087625 A1    Mar. 21, 2019

(30) Foreign Application Priority Data
Sep. 19, 2017    (CN) .......................... 2017 1 0847716

(51) Int. Cl.
*G06K 9/20*    (2006.01)
*G06K 9/00*    (2006.01)
(Continued)

(52) U.S. Cl.
CPC ...... *G06K 9/0004* (2013.01); *H01L 31/02325* (2013.01); *H01L 31/03762* (2013.01);
(Continued)

(58) Field of Classification Search
CPC .................................................... G06K 9/0004
See application file for complete search history.

(56) References Cited

FOREIGN PATENT DOCUMENTS

| CN | 101285975 A | 10/2008 |
|----|-------------|---------|
| CN | 102315235 A | 1/2012  |

(Continued)

OTHER PUBLICATIONS

Chiang et al., "Integrated Ambient Light Sensor With Nanocrystalline Silicon on a Low-Temperature Polysilicon Display Panel", IEEE Transactions on Electron Devices, vol. 56, No. 4, Apr. 2009, pp. 578-586. (Year: 2009).*

(Continued)

*Primary Examiner* — Brian Werner
(74) *Attorney, Agent, or Firm* — Foley & Lardner LLP

(57) ABSTRACT

The present disclosure provides a photoelectric sensor, an array substrate, a display panel and a display device. The photoelectric sensor is used for fingerprint recognition, and includes a first electrode layer, being lighttight. The photoelectric sensor further includes a first transparent electrode layer, disposed opposite to the first electrode layer and receiving incident light, and a light sensing layer, located between the first electrode layer and the first transparent electrode layer. The light sensing layer includes a plurality of nanocrystalline silicon particles with different particle sizes.

14 Claims, 4 Drawing Sheets

(51) Int. Cl.
H01L 31/0232 (2014.01)
H01L 31/0376 (2006.01)
H01L 31/101 (2006.01)
G02F 1/133 (2006.01)

(52) U.S. Cl.
CPC ...... *H01L 31/1013* (2013.01); *G02F 1/13318* (2013.01); *G02F 2201/58* (2013.01); *Y02P 70/521* (2015.11)

(56) References Cited

FOREIGN PATENT DOCUMENTS

| CN | 102709297 A | 10/2012 |
| CN | 106169484 A | 11/2016 |
| CN | 104937722 B | 3/2017 |

OTHER PUBLICATIONS

Chinese Office Action dated Nov. 2, 2018, from application No. 201710847716.9.
Chinese Office Action dated Jun. 4, 2019, from application No. 201710847716.9.

* cited by examiner

PHOTOELECTRIC SENSOR, ARRAY SUBSTRATE, DISPLAY PANEL AND DISPLAY DEVICE

CROSS-REFERENCE

The present application is based upon and claims priority to Chinese Patent Application No. 201710847716.9, filed on Sep. 19, 2017, and the entire contents thereof are incorporated herein by reference.

TECHNICAL FIELD

The present disclosure relates to the field of display technology, in particular, to a photoelectric sensor, an array substrate including the photoelectric sensor, a display panel and a display device.

BACKGROUND

Fingerprint is an invariable and native feature that makes a person different from others, which includes a series of ridges and valleys on the surface of fingertip skin. With the development of science and technology, fingerprint recognition is increasingly used, for example for investigation, entrance guard, smart phone, tablet computer, car, bank payment, etc.

A photoelectric sensor is generally used to identify a fingerprint. However, the photoelectric sensor mainly responds to visible light within a limited wave band, and thus the spectral response peak is relatively simple. Therefore, some of the light reflected by the finger cannot be absorbed and utilized, and the photocurrent signal in the photoelectric sensor is relatively weak, which results in low recognition accuracy and efficiency of a fingerprint recognition display.

In view of this, a photoelectric sensor capable of responding in a broad spectrum is required for fingerprint recognition in order to improve the recognition accuracy and efficiency of the fingerprint recognition display.

It should be noted that the information disclosed in the foregoing background section is only for enhancement of understanding of the background of the present disclosure and therefore may include information that does not constitute the prior art that is already known to those of ordinary skill in the art.

SUMMARY

The present disclosure provides a photoelectric sensor, an array substrate including the photoelectric sensor, a display panel and a display device.

According to one aspect of the present disclosure, there is provide a photoelectric sensor for fingerprint recognition, including a first transparent electrode layer configured to receive incident light, a first electrode layer that is lighttight and disposed opposite to the first transparent electrode layer, and a light sensing layer, located between the first electrode layer and the first transparent electrode layer. The light sensing layer includes a plurality of nanocrystalline silicon particles with different particle sizes.

In an exemplary arrangement of the present disclosure, the light sensing layer includes a plurality of nanocrystalline silicon layers, each including nanocrystalline silicon particles with a same particle size. Nanocrystalline silicon particles included in one of the plurality of nanocrystalline silicon layers have a particle size different from that of nanocrystalline silicon particles included in another of the plurality of nanocrystalline silicon layers.

In an exemplary arrangement of the present disclosure, the plurality of nanocrystalline silicon layers are stacked, and the particle sizes of the nanocrystalline silicon particles of the plurality of nanocrystalline silicon layers increase gradually along a direction from the first transparent electrode layer to the first electrode layer.

In an exemplary arrangement of the present disclosure, a connecting layer is disposed between two adjacent nanocrystalline silicon layers of the plurality of nanocrystalline silicon layers, configured to connect the two adjacent nanocrystalline silicon layers.

In an exemplary arrangement of the present disclosure, a second transparent electrode layer, a third transparent electrode layer and an insulating layer are disposed between two adjacent nanocrystalline silicon layers of the plurality of nanocrystalline silicon layers, and the third transparent electrode layer is disposed opposite to the second transparent electrode layer and the insulating layer is located between the second transparent electrode layer and the third transparent electrode layer.

In an exemplary arrangement of the present disclosure, the light sensing layer includes one nanocrystalline silicon layer, and the plurality of nanocrystalline silicon particles with different particle sizes are disposed in the one nanocrystalline silicon layer.

In an exemplary arrangement of the present disclosure, the first transparent electrode layer, the second transparent electrode layer and the third transparent electrode layer include metal or metal oxide.

According to some arrangements of the present disclosure, there is provided an array substrate, including a substrate, a thin film transistor, formed on the substrate, and the photoelectric sensor as described herein, formed on the substrate and electrically coupled to the thin film transistor.

According to some arrangements of the present disclosure, there is provided a display panel including the array substrate described herein.

According to some arrangements of the present disclosure, there is provided a display device including the display panel described herein.

It is to be understood that both the foregoing general description and the following detailed description are exemplary and explanatory only and are not restrictive of the present disclosure.

BRIEF DESCRIPTION OF THE DRAWINGS

In order to more clearly illustrate the technical solution of the arrangements of the present disclosure, the following drawings, which are to be used in the description of the arrangements or related art, will be briefly described. It will be apparent that the drawings described in the following description refer only to some arrangements of the present disclosure and are not limitation to the present disclosure.

The accompanying drawings herein, which are incorporated in and constitute a part of this description, illustrate arrangements consistent with the present disclosure, and together with the description serve to explain the principles of the present disclosure. Obviously, the drawings in the following description are merely some arrangements of the present disclosure, and those skilled in the art can also obtain other drawings based on these drawings without any creative work. In the drawing.

DETAILED DESCRIPTION

Figure 1:
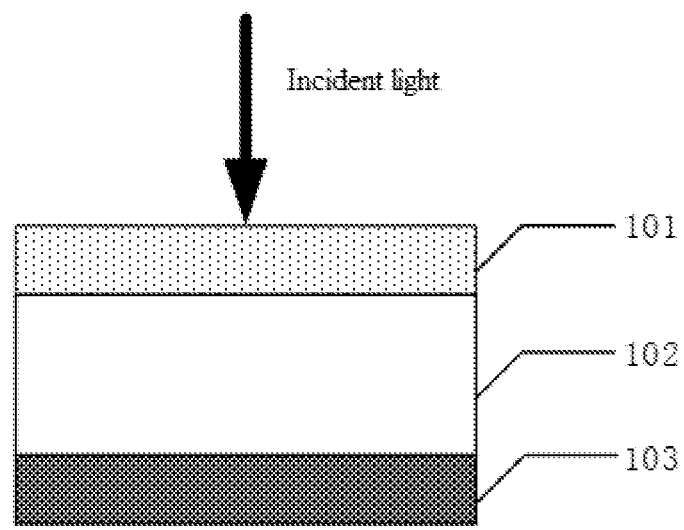
FIG. 1 shows a schematic structure view of a photoelectric sensor according to an arrangement of the present disclosure.

Exemplary arrangements will now be described more fully with reference to the accompanying drawings. However, the exemplary arrangements can be implemented in various forms and should not be construed as limited to the examples set forth herein; rather, these arrangements are provided so that this disclosure will be more complete and thorough, and will fully convey the concept of the exemplary arrangements to those skilled in the art. The features, structures, or characteristics described may be combined in any suitable manner in one or more arrangements. In the following description, numerous specific details are provided to provide a thorough understanding of the arrangements of the present disclosure. However, those skilled in the art will recognize that the technical solutions of the present disclosure may be practiced without one or more of the specific details, or that other methods, components, devices, steps, etc. may be employed. In other instances, well-known technical solutions have not been shown or described in detail to avoid obscuring aspects of the present disclosure.

The terms "a", "an", "the", and "said" are used in the description to indicate that one or more elements/components/etc. are present; the terms "comprising", "including" and "having" should be understood in an open-ended meaning and are used to mean that there may be additional elements/components/etc. in addition to listed elements/components/etc. The terms "first" and "second" are used only as labels, not to limit the number of objects thereof.

Moreover, the drawings are merely schematic illustrations of the present disclosure and are not necessarily drawn to scale. The same reference numerals in the drawings denote the same or similar parts, and their repeated description will be omitted. Some of the blocks shown in the figures are functional entities and do not necessarily have to correspond to physically or logically independent entities. These functional entities may be implemented in software, or implemented in one or more hardware modules or integrated circuits, or implemented in different network and/or processor devices and/or microcontroller devices.

In the present exemplary arrangement, a photoelectric sensor is first provided. Referring now to FIG. 1, the structure and working process of the photoelectric sensor of the present disclosure are illustratively described.

As shown in FIG. 1, the photoelectric sensor 100 sequentially includes a first transparent electrode layer 101, a light sensing layer 102, and a first electrode layer 103 from top to bottom in the incident light direction. The first electrode layer 103 is lighttight, lightproof, or opaque to light. The light sensing layer 102 is located between the first transparent electrode layer 101 and the first electrode layer 103, and includes a plurality of nanocrystalline silicon particles with different particle sizes.

The first transparent electrode layer 101 may be formed of any transparent conductive material. The transparent conductive material includes a metal material or a metal oxide material. The metal material may be Cu, Fe, Ni, Ag, Au, or Pt. The first transparent electrode layer 101 may be a metal nanowire network conductive film formed of the above metal material; the metal oxide material may be a transparent conductive oxide, such as FTO, ITO, ZTO, etc. In some arrangements, the first transparent electrode layer 101 is an ITO transparent electrode.

The light sensing layer 102 includes a plurality of nanocrystalline silicon particles located between the first transparent electrode layer 101 and the first electrode layer 103. The particle sizes of the plurality of nanocrystalline silicon particles may be completely different from each other or may be partially the same. In some arrangements, the particle sizes of the plurality of nanocrystalline silicon particles are completely different from each other. The light sensing layer 102 may be a multi-layer structure or a single-layer structure formed of the plurality of nanocrystalline silicon particles having different particle sizes. When the light sensing layer 102 includes a plurality of nanocrystalline silicon layers, each nanocrystalline silicon layer is formed of the nanocrystalline silicon particles with a same particle size, and the plurality of nanocrystalline silicon layers are stacked, and the particle sizes of the nanocrystalline silicon particles of the plurality of nanocrystalline silicon layers are increased gradually along a direction from the first transparent electrode layer 101 to the first electrode layer 103. When the light sensing layer 102 is a single-layer structure, the layer simultaneously contains a plurality of nanocrystalline silicon particles with different particle sizes.

The first electrode layer 103 is disposed opposite to the first transparent electrode layer 101, and the first electrode layer 103 may be formed of an opaque metal or a metal alloy. The metal may be Mo, Cu, Ag, Au, Pt, Ni, Fe, Pb, and the like, the metal alloy may be a Pt—Pb alloy, a Pt—Au alloy, a Cu—Fe alloy, a Ni—Co alloy, and the like. The opaqueness of the first electrode layer 103 prevents light on the back of the photoelectric sensor 100 from entering into the photoelectric sensor from the back electrode of the photoelectric sensor 100, causing a change in photocurrent, which affects the accuracy of fingerprint recognition.

Figure 2:
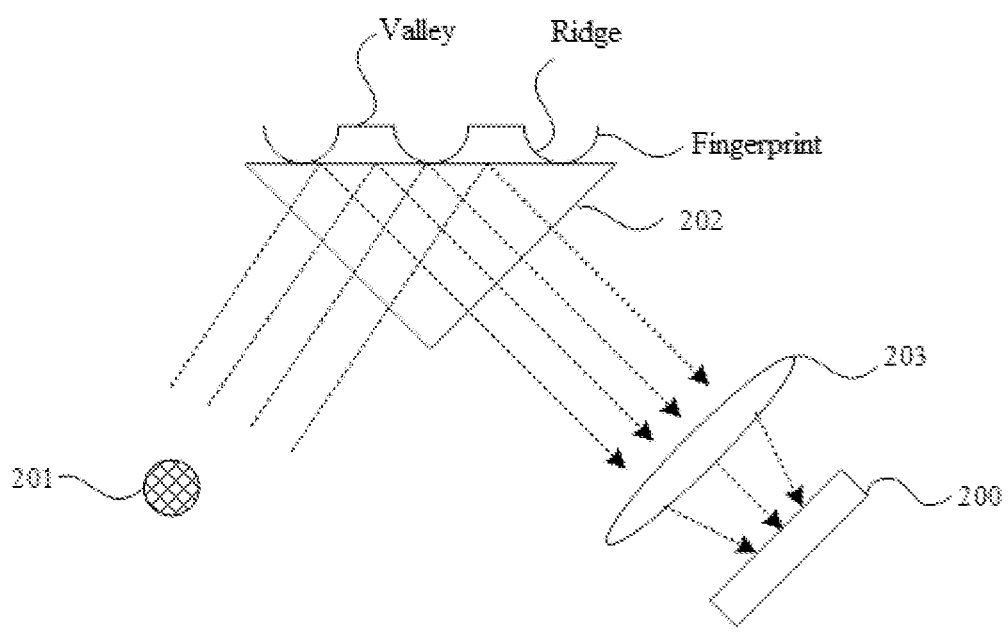
FIG. 2 shows a view of an optical path in a fingerprint recognition according to an arrangement of the present disclosure.
Figure 3:
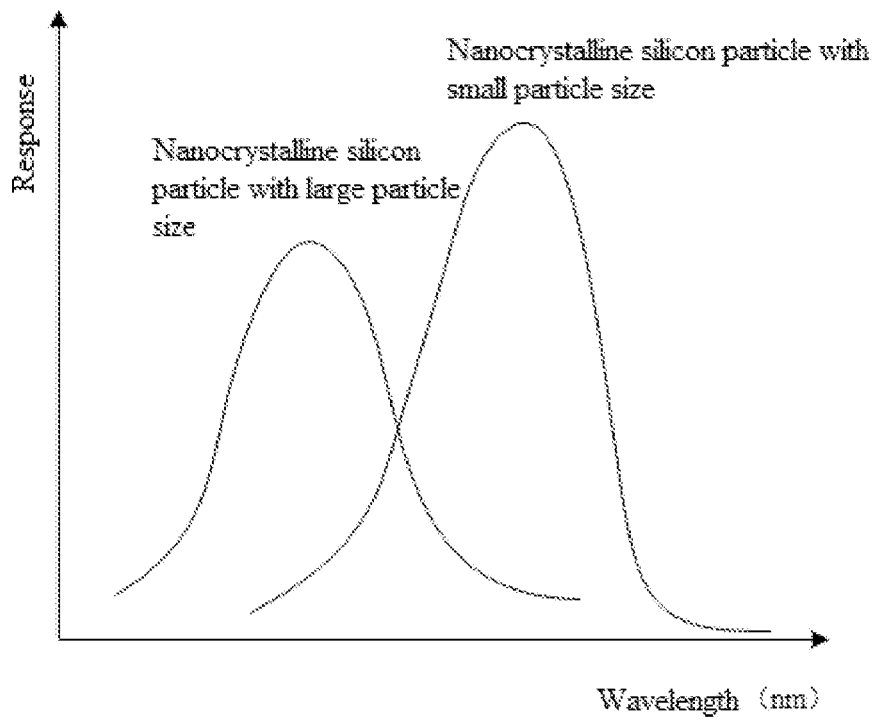
FIG. 3 shows a schematic diagram of spectral responses peak of nanocrystalline silicon photoelectric detectors with different particle sizes according to an exemplary arrangement of the present disclosure.

FIG. 2 shows the working mechanism of the photoelectric sensor 200. Specifically, when the user's finger presses on the screen surface, the light emitted by the light source 201 may irradiate on the fingerprint of the finger through the prism 202 and the like. Because the valley and ridge of the fingerprint have different heights, the ridge is in contact with the screen, and there is a gap between the valley and the screen which is filled with air. Therefore, the light reflected by the position corresponding to the valley is different from that corresponding to the ridge, and thus there are differences in the light incident on the photoelectric sensor 200 through the lens 203. The light incident on the photoelectric sensor 200 enters the inside of the photoelectric sensor 200 through the first transparent electrode layer. Due to the quantum confinement effect on the surface of the nanocrystalline silicon particles, the band width varies with the size of the nanocrystalline silicon particle, and the corresponding peak wavelength of the spectral response also changes. Therefore, the nanocrystalline silicon particles with different particle sizes respond to different wavelengths of light. As shown in FIG. 3, the nanocrystalline silicon particles of small particle size respond to short-wavelength light and the nanocrystalline silicon particles of large particle size respond to long-wavelength light. As the nanocrystalline silicon particles generate different photocurrents in response to different wavelengths of light, a detection element can determine the distribution of valleys and ridges in the finger according to the difference in photocurrent, thereby determining the user's fingerprint image.

The photoelectric sensor in the present disclosure includes a plurality of nanocrystalline silicon particles with different particle sizes. Because the nanocrystalline silicon particles with different particle sizes respond to light of different spectral peak wavelengths, the spectral response range of the photoelectric sensor is expanded, and the light absorption rate and the intensity of the photocurrent signal of the photoelectric sensor are improved, which further improves the accuracy and recognition efficiency of the fingerprint recognition display.

Next, the structure of the photoelectric sensor in the present disclosure will be further described with respect to different arrangements of the nanocrystalline silicon particles.

Figure 4:
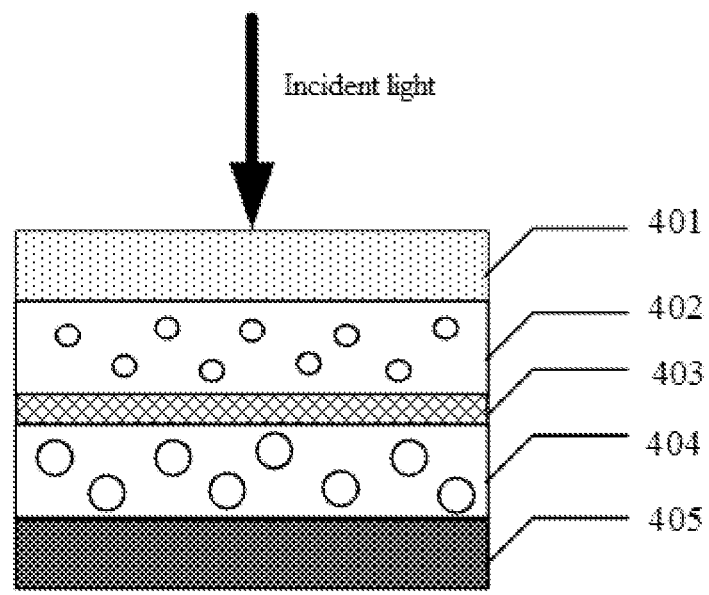
FIG. 4 shows a schematic structure view of a photoelectric sensor according to an arrangement of the present disclosure.

FIG. 4 shows a structure of a photoelectric sensor 400 with a light sensing layer (e.g., the light sensing layer 102 of FIG. 1) having a two-layer structure. Referring to FIG. 4, the photoelectric sensor 400 sequentially includes a first transparent electrode layer 401, a first nanocrystalline silicon layer 402, a connecting layer 403, a second nanocrystalline silicon layer 404, and a first electrode layer 405 from top to bottom in the incident light direction. The particle size of the nanocrystalline silicon particle in the first nanocrystalline silicon layer 402 is larger than or smaller than the particle size of the nanocrystalline silicon particle in the second nanocrystalline silicon layer 404. In some arrangements, the particle size of the nanocrystalline silicon particle in the first nanocrystalline silicon layer 402 is smaller than the particle size of the nanocrystalline silicon particle in the second nanocrystalline silicon layer 404, so that the short wavelength light having a small penetration depth firstly makes the nanocrystalline silicon particle with smaller particle size in the first nanocrystalline silicon layer 402 responded when being introduced into photoelectric sensor 400, and then the long wavelength light having a large penetration depth makes the nanocrystalline silicon particle with larger particle size in the second nanocrystalline silicon layer 404 responded, which broadens the spectral response range and improves the light absorption rate and the photocurrent intensity. The connecting layer 403 includes a light-transmitting conductive material for connecting the first nanocrystalline silicon layer 402 and the second nanocrystalline silicon layer 404 in series and transmitting long wavelength light into the second nanocrystalline silicon layer 404. The light-transmitting conductive material may be a light-transmissive and conductive material that is well known in the art and will not be described here.

In order to ensure the uniformity of the photocurrent in the photoelectric sensor 400, an external voltage may be applied to the photoelectric sensor 400. Under the external voltage, the photocurrent is conducted from the first nanocrystalline silicon layer 402 to the first electrode layer 405 and then conducted to the detection element to filter the electrical signal, finally a fingerprint image is generated.

Figure 5:
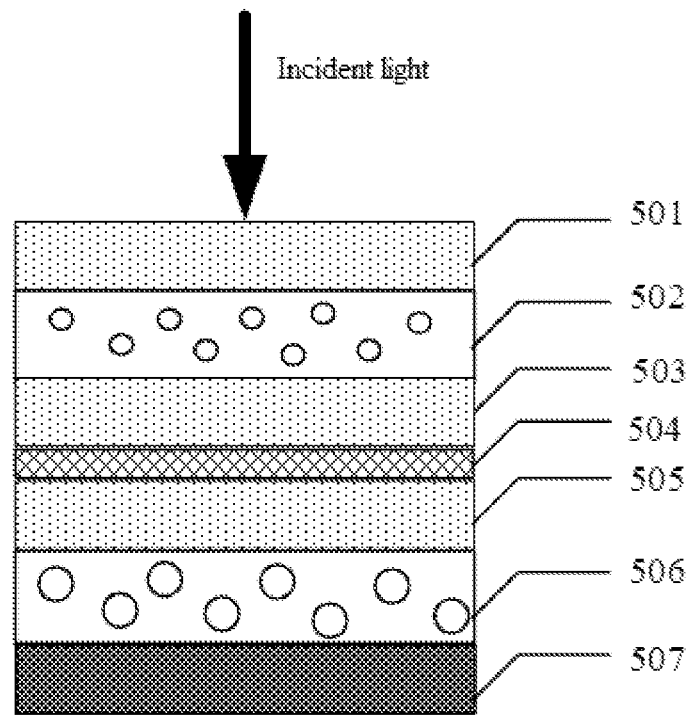
FIG. 5 shows a schematic structure view of a photoelectric sensor according to an arrangement of the present disclosure.

FIG. 5 shows a structure of another photoelectric sensor 500 with a light sensing layer (e.g., the light sensing layer 102 of FIG. 1) having a two-layer structure. The photoelectric sensor 500 sequentially includes a first transparent electrode layer 501, a first nanocrystalline silicon layer 502, a second transparent electrode layer 503, an insulating layer 504, a third transparent electrode layer 505, a second nanocrystalline silicon layer 506 and a first electrode layer 507 from top to bottom in the incident light direction. The particle size of the nanocrystalline silicon particle in the first nanocrystalline silicon layer 502 is larger than or smaller than the particle size of the nanocrystalline silicon particle in the second nanocrystalline silicon layer 506. In some arrangements, the particle size of the nanocrystalline silicon particle in the first nanocrystalline silicon layer 502 is smaller than the particle size of the nanocrystalline silicon particle in the second nanocrystalline silicon layer 506. The first transparent electrode layer, the second transparent electrode layer, and the third transparent electrode layer may be metal or metal oxide. In some arrangements, all the transparent electrode layers are formed of ITO. The insulating layer 504 is a commonly used insulating material in the art, such as SiOX, PMMA and the like, as long as the insulating material may ensure the light to be transmitted through and have an insulating function, which will not be described here.

In the exemplary arrangement, the first nanocrystalline silicon layer 502 and the second nanocrystalline silicon layer 506 are separated by the insulating layer 504, so there is no need to consider whether the directions of the photocurrents in the two nanocrystalline silicon layers are the same. Each of the nanocrystalline silicon structures separated by the insulating layer is electrically connected to A detection element, and the electrical connecting manner may be any electrical connecting means known in the art, and therefore will not be described here.

It should be understood by those skilled in the art that the photoelectric sensor structures shown in FIGS. 4-5 are intended to illustrate the structure and operation principle of the photoelectric sensor of the present disclosure, rather than limiting the present disclosure to include two nanocrystalline silicon layers. In the present disclosure, it may provide a plurality of nanocrystalline silicon layers containing nanocrystalline silicon particles, such as three layers, four layers, and the like. When a plurality of nanocrystalline silicon layers are provided, the particle sizes of the nanocrystalline silicon particles contained in the plurality of nanocrystalline silicon layers are different from each other or are not completely the same. In some arrangements, the particle sizes of the nanocrystalline silicon particles contained in the plurality of nanocrystalline silicon layers are different from each other, and the plurality of nanocrystalline silicon layers are stacked, and the particle sizes of the nanocrystalline silicon particles of the plurality of nanocrystalline silicon layers are increased gradually along a direction from the first transparent electrode layer to the first electrode layer.

Figure 6:
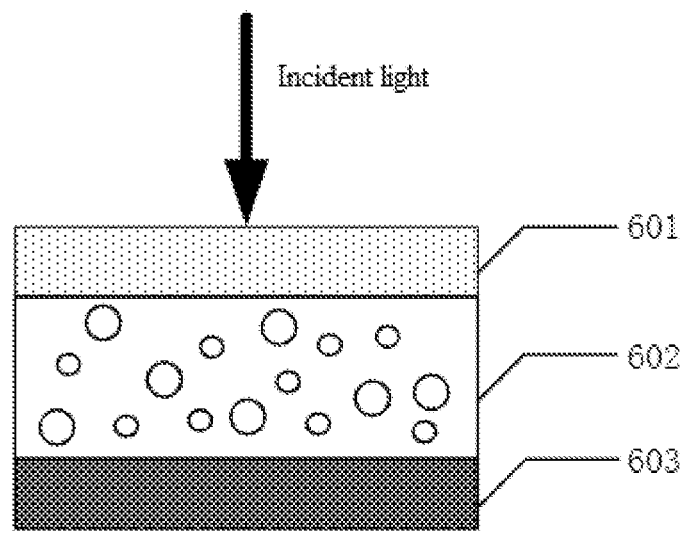
FIG. 6 shows a schematic structure view of a photoelectric sensor according to an arrangement of the present disclosure.

FIG. 6 shows a structure of a photoelectric sensor 600 in which two different particle sizes of nanocrystalline silicon particles are disposed in a same nanocrystalline silicon layer. The photoelectric sensor 600 sequentially includes a first transparent electrode layer 601, a nanocrystalline silicon layer 602, and a first electrode layer 603 from top to bottom in the incident light direction. The nanocrystalline silicon layer 602 includes nanocrystalline silicon particles with two different particle sizes. The nanocrystalline silicon particles with different particle sizes in the nanocrystalline silicon layer 602 may be uniformly distributed or non-uniformly distributed.

It should be understood by those skilled in the art that the photoelectric sensor structure shown in FIG. 6 is intended to illustrate the structure and working principle of the photoelectric sensor of the present disclosure, rather than limiting the disclosure to include two kinds of nanocrystalline silicon particles. The present disclosure also includes nanocrystalline silicon particles with a plurality of different particle sizes, such as three, four, or even more, to further expand the spectral response range of the photoelectric sensor and increase the light absorption rate and the intensity of the photocurrent signal.

The nanocrystalline silicon layer in the present disclosure may be formed by using a nanocrystalline growth technique commonly used in the art, such as PECVD, LPCVD, hydrothermal method, and the like. Taking the preparation of a nanocrystalline silicon film by PECVD as an example, the factors influencing the preparation of the nanocrystalline silicon film by PECVD include hydrogen dilution rate, substrate temperature, reaction pressure, excitation power and excitation frequency. In actual production, the skilled person may change some or all of the above parameters to adjust the particle size of the nanocrystalline silicon particle to obtain nanocrystalline silicon particles and nanocrystalline silicon layers having different particle sizes.

Figure 7:
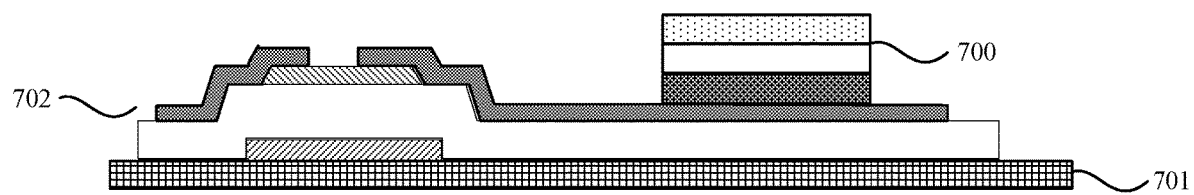
FIG. 7 shows a schematic structure view of an array substrate according to an arrangement of the present disclosure.

Further, the exemplary arrangement also provides an array substrate. As shown in FIG. 7, the array substrate includes a substrate 701, a thin film transistor 702, and a photoelectric sensor 700. The thin film transistor 702 is located on the substrate 701, and the thin film transistor 702 may be a top gate structure or a bottom gate structure. In some arrangements, the thin film transistor 702 is a bottom gate structure. The photoelectric sensor 700 is the photoelectric sensor disclosed in the present disclosure, and is located on the thin film transistor 702 to be coupled to the source or drain of the thin film transistor 702.

The photoelectric sensor 700 converts light signal reflected by the finger into electrical signal, and transmits the electrical signal to the thin film transistor 702 for detection to obtain a fingerprint image finally, which improves the efficiency and accuracy of fingerprint recognition.

Figure 8:
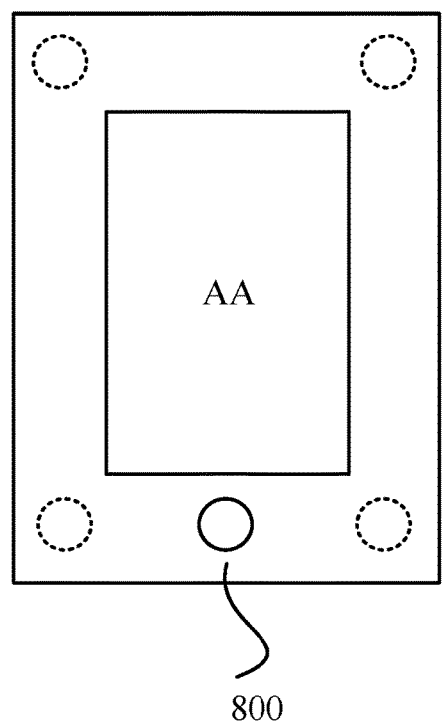
FIG. 8 shows a schematic structure view of a display panel according to an arrangement of the present disclosure.

Further, the exemplary arrangement also provides a display panel including the above array substrate. Further, the display panel includes a color film substrate disposed opposite to the array substrate, and a liquid crystal layer disposed between the array substrate and the color film substrate. Referring to FIG. 8, the photoelectric sensor 800 may be disposed at an edge (a non-display area) of the display panel, such as the middle portion of the lower side, the lower right corner, the left lower corner, and the like of the display panel, which facilitates the operation of the user and thus enhances the user's comfort. Of course, the photoelectric sensor 800 may also be disposed at other positions such as a display area of the display panel, which is not limited in the exemplary arrangement.

Further, the present exemplary arrangement also provides a display device, which may include the above-mentioned display panel. The display device may specifically be a product or component having any display function such as a liquid crystal panel, a liquid crystal display, a liquid crystal television, an organic electroluminescent display OLED panel, an OLED display, an OLED television, an electronic paper or a digital photo frame.

Those skilled in the art will readily recognize other arrangements of the present disclosure upon consideration of the specification and practice of the present disclosure disclosed herein. This application is intended to cover any variations, uses, or adaptations of the present disclosure which follow the general principles of the present disclosure and include any common knowledge or conventional techniques in this technical field not disclosed by the present disclosure. The description and examples are to be considered exemplary only, with the true scope and spirit of the present disclosure being indicated by the following claims.

It should be understood that the present disclosure is not limited to the precise structure that has been described above and shown in the drawings, and various modifications and changes can be made without departing from the scope thereof. The scope of the present disclosure is limited only by the attached claims.

What is claimed is:

1. A photoelectric sensor for fingerprint recognition, comprising:
   a first transparent electrode layer, configured to receive incident light;
   a first electrode layer, being lighttight and disposed opposite to the first transparent electrode layer; and
   a light sensing layer, located between the first electrode layer and the first transparent electrode layer, wherein the light sensing layer comprises a plurality of nanocrystalline silicon particles with different particle sizes,
   wherein the light sensing layer comprises:
   a plurality of nanocrystalline silicon layers, each comprising nanocrystalline silicon panicles with a same particle size,
   wherein the nanocrystalline silicon particles comprised in one of the plurality of nanocrystalline silicon layers have a particle size different from that of the nanocrystalline silicon particles comprised in another of the plurality of nanocrystalline silicon layers.

2. The photoelectric sensor according to claim 1, wherein the plurality of nanocrystalline silicon layers are stacked, and the particle sizes of the nanocrystalline silicon particles of the plurality of nanocrystalline silicon layers increase gradually along a direction from the first transparent electrode layer to the first electrode layer.

3. The photoelectric sensor according to claim 1, wherein a connecting layer is disposed between two adjacent nanocrystalline silicon layers of the plurality of nanocrystalline silicon layers, configured to connect the two adjacent nanocrystalline silicon layers.

4. The photoelectric sensor according to claim 1, wherein a second transparent electrode layer, a third transparent electrode layer and an insulating layer are disposed between two adjacent nanocrystalline silicon layers of the plurality of nanocrystalline silicon layers, and
   the third transparent electrode layer is disposed opposite to the second transparent electrode layer and the insulating layer is located between the second transparent electrode layer and the third transparent electrode layer.

5. The photoelectric sensor according to claim 1, wherein the first transparent electrode layer comprises one of metal and metal oxide.

6. The photoelectric sensor according to claim 4, wherein the second transparent electrode layer and the third transparent electrode layer comprise one of metal and metal oxide.

7. An array substrate, comprising:
a substrate;
a thin film transistor, formed on the substrate; and
a photoelectric sensor for fingerprint recognition, formed on the substrate and electrically coupled to the thin film transistor,
wherein the photoelectric sensor comprises:
a first transparent electrode layer, configured to receive incident light;
a first electrode layer, being lighttight and disposed opposite to the first transparent electrode layer; and
a light sensing layer, located between the first electrode layer and the first transparent electrode layer, wherein the light sensing layer comprises a plurality of nanocrystalline silicon particles with different particle sizes,
wherein the light sensing layer comprises:
a plurality of nanocrystal line silicon layers, each comprising nanocrystalline silicon particles with a same particle size,
wherein the nanocrystalline silicon particles comprised in one of the plurality of nanocrystalline silicon layers have a particle size different from that of the nanocrystalline silicon particles comprised in another of the plurality of nanocrystalline silicon layers.

8. The array substrate according to claim 7, wherein the plurality of nanocrystalline silicon layers are stacked, and the particle sizes of the nanocrystalline silicon particles comprised in the plurality of nanocrystalline silicon layers increase gradually along a direction from the first transparent electrode layer to the first electrode layer.

9. The array substrate according to claim 7, wherein a connecting layer is disposed between two adjacent nanocrystalline silicon layers of the plurality of nanocrystalline silicon layers, configured to connect the two adjacent nanocrystalline silicon layers.

10. The array substrate according to claim 7, wherein a second transparent electrode layer, a third transparent electrode layer and an insulating layer are disposed between two adjacent nanocrystalline silicon layers of the plurality of nanocrystalline silicon layers, and
the third transparent electrode layer is disposed opposite to the second transparent electrode layer and the insulating layer is located between the second transparent electrode layer and the third transparent electrode layer.

11. The array substrate according to claim 7, wherein the first transparent electrode layer comprises one of metal and metal oxide.

12. The array substrate according to claim 10, wherein the second transparent electrode layer and the third transparent electrode layer comprise one of metal and metal oxide.

13. A display panel, comprising an array substrate, wherein the array substrate comprises:
a substrate;
a thin film transistor, formed on the substrate; and
a photoelectric sensor for fingerprint recognition, formed on the substrate and electrically coupled to the thin film transistor,
wherein the photoelectric sensor comprises:
a first transparent electrode layer, configured to receive incident light;
a first electrode layer, being lighttight and disposed opposite to the first transparent electrode layer; and
a light sensing layer, located between the first electrode layer and the first transparent electrode layer and comprising a plurality of nanocrystalline silicon particles with different particle sizes,
wherein the light sensing layer comprises:
a plurality of nanocrystalline silicon layers, each comprising nanocrystalline silicon particles with a same particle size,
wherein the nanocrystalline silicon particles comprised in one of the plurality of nanocrystalline silicon layers have a particle size different from that of the nanocrystalline silicon particles comprised in another of the plurality of nanocrystalline silicon layers.

14. A display device, comprising a display panel, wherein the display panel comprises an array substrate, the array substrate comprises:
a substrate;
a thin film transistor, formed on the substrate; and
a photoelectric sensor for fingerprint recognition, formed on the substrate and electrically coupled to the thin film transistor,
wherein the photoelectric sensor comprises:
a first transparent electrode layer, configured to receive incident light;
a first electrode layer, being lighttight and disposed opposite to the first transparent electrode layer; and
a light sensing layer, located between the first electrode layer and the first transparent electrode layer and comprising a plurality of nanocrystalline silicon particles with different particle sizes,
wherein the light sensing layer comprises:
a plurality of nanocrystalline silicon layers, each comprising nanocrystalline silicon particles with a same particle size,
wherein the nanocrystalline silicon particles comprised in one of the plurality of nanocrystalline silicon layers have a particle size different from that of the nanocrystalline silicon particles comprised in another of the plurality of nanocrystalline silicon layers.

* * * * *